(12) United States Patent
Martin

(10) Patent No.: US 6,591,162 B1
(45) Date of Patent: Jul. 8, 2003

(54) SMART LOAD PORT WITH INTEGRATED CARRIER MONITORING AND FAB-WIDE CARRIER MANAGEMENT SYSTEM

(75) Inventor: Raymond S. Martin, Fremont, CA (US)

(73) Assignee: Asyst Technologies, Inc., Fremont, CA (US)

( * ) Notice: Subject to any disclaimer, the term of this patent is extended or adjusted under 35 U.S.C. 154(b) by 160 days.

(21) Appl. No.: 09/641,032

(22) Filed: Aug. 16, 2000

Related U.S. Application Data

(63) Continuation of application No. 09/640,463, filed on Aug. 15, 2000, now abandoned.

(51) Int. Cl.[7] .............................................. G06F 17/00
(52) U.S. Cl. ...................................... 700/228; 700/225
(58) Field of Search ................. 707/3, 104.1; 700/112, 700/113, 121, 215, 225, 229, 228, 230, 213

(56) References Cited

U.S. PATENT DOCUMENTS

| | | | |
|---|---|---|---|
| 4,532,970 A | 8/1985 | Tullis et al. | 141/98 |
| 4,534,389 A | 8/1985 | Tullis | 141/98 |
| 4,724,874 A | 2/1988 | Parikh et al. | 141/98 |
| 4,827,110 A | 5/1989 | Rossi et al. | 235/376 |
| 4,888,473 A | 12/1989 | Rossi et al. | 235/376 |
| 4,974,166 A | 11/1990 | Maney et al. | 364/478 |
| 4,995,430 A | 2/1991 | Bonora et al. | 141/98 |
| 5,097,421 A | 3/1992 | Maney et al. | 364/478 |
| 5,166,884 A | 11/1992 | Maney et al. | 364/468 |
| 5,339,074 A | 8/1994 | Shindley et al. | 340/825.31 |
| 5,382,127 A | 1/1995 | Garric et al. | 414/217 |
| 5,754,451 A | 5/1998 | Williams | 364/551.01 |
| 5,846,338 A | 12/1998 | Bonora et al. | 734/11 |
| 5,862,054 A * | 1/1999 | Li | 700/108 |
| 5,868,803 A | 2/1999 | Chen | 29/25.01 |
| 5,914,475 A * | 6/1999 | Kimura et al. | 235/432 |
| 6,056,026 A | 5/2000 | Fosnight et al. | 141/98 |
| 6,123,120 A | 9/2000 | Yotsumoto et al. | 141/65 |
| 6,148,246 A * | 11/2000 | Kawazome | 700/106 |
| 6,152,669 A | 11/2000 | Morita et al. | 414/217 |
| 6,188,323 B1 | 2/2001 | Rosenquist et al. | 340/686.5 |
| 6,208,909 B1 | 3/2001 | Kato et al. | 700/218 |
| 6,240,335 B1 | 5/2001 | Wehrung et al. | 700/230 |
| 6,427,096 B1 * | 7/2002 | Lewis et al. | 700/228 |

OTHER PUBLICATIONS

"SMIF: A Technology for Wafer Cassette Transfer in VLSI Manufacturing," by Mihir Parikh and Ulrich Kaempf, *Solid State Technology*, Jul. 1984, pp. 111–115.

* cited by examiner

*Primary Examiner*—Jack Choules
(74) *Attorney, Agent, or Firm*—O'Melveny & Myers LLP

(57) ABSTRACT

A load port assembly capable of monitoring a plurality of performance characteristics of wafer carriers. The load port assembly may include one or more of the following monitoring systems: a torque measurement system, a wafer height measurement system, a carrier identification reader, an information pad, a resistivity measurement system, a cleanliness measurement system, a seal performance detector, and a relative humidity detector. In a preferred embodiment of the present invention, each of the monitoring systems are integrated into either a carrier advance plate or a port door of the load port assembly.

8 Claims, 9 Drawing Sheets

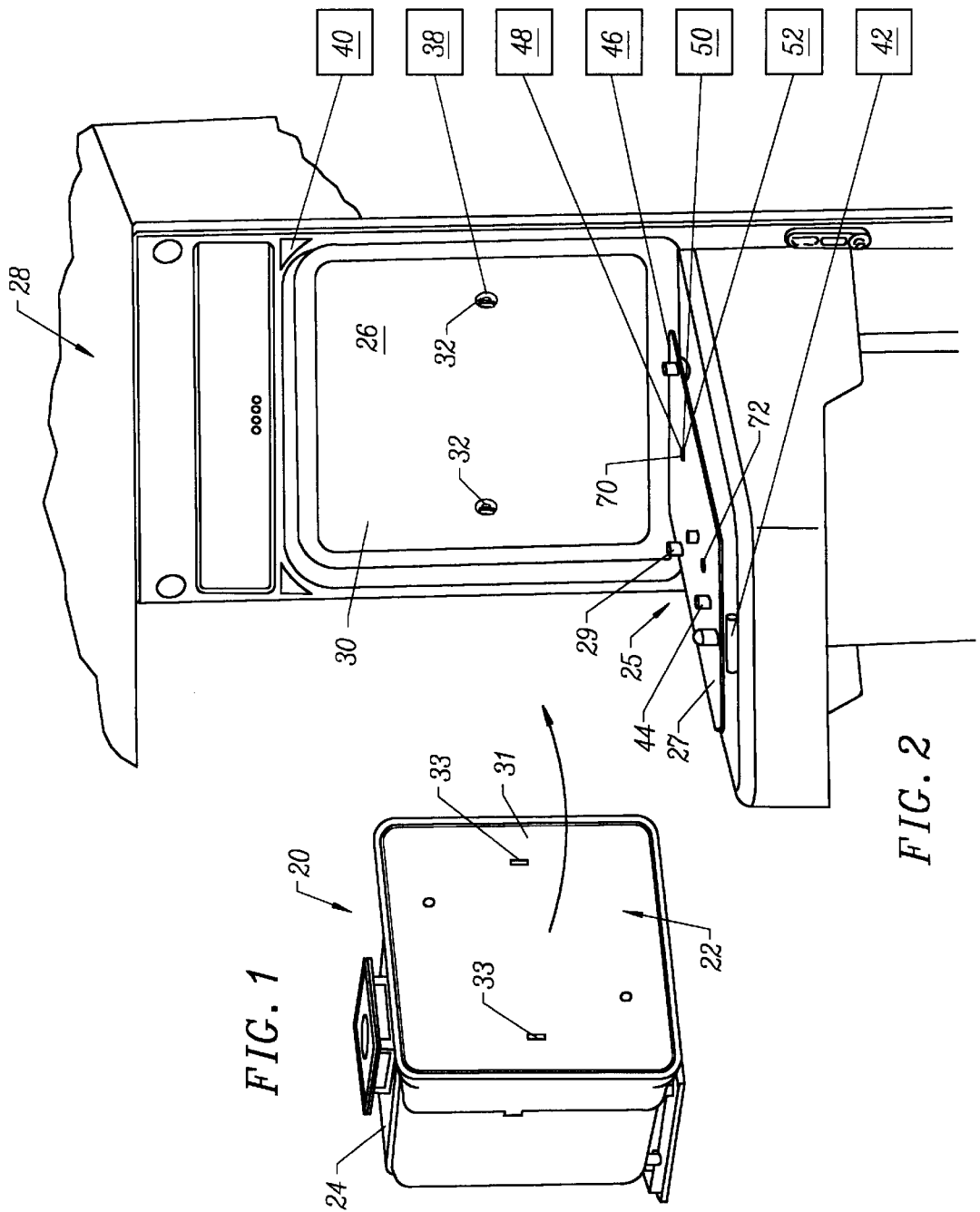

SMART LOAD PORT WITH INTEGRATED CARRIER MONITORING AND FAB-WIDE CARRIER MANAGEMENT SYSTEM

CROSS REFERENCE TO RELATED APPLICATION

This application is a continuation in part of U.S. application Ser. No. 09/640,463, filed Aug. 15 2000, now abandoned, which application is incorporated by reference herein in its entirety.

BACKGROUND OF THE INVENTION

1. Field of the Invention

The present invention relates to the fabrication of integrated circuits on semiconductor wafers, and in particular to a system capable of monitoring a plurality of performance characteristics of wafer carriers and to a system for managing carrier operation on a fab-wide basis.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed carriers, or pods, used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF carriers and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

SMIF carriers are in general comprised of a carrier door which mates with a carrier shell to provide a sealed environment in which wafers may be stored and transferred. So called "bottom opening" carriers are known, where the carrier door is horizontally provided at the bottom of the carrier, and the wafers are supported in a cassette which is in turn supported on the carrier door. It is also known to provide "front opening" carriers, in which the carrier door is located in a vertical plane, and the wafers are supported either in a cassette mounted within the carrier shell, or to shelves mounted in the carrier shell.

A typical wafer fab has several different types of tools into which wafers from a carrier are loaded. Processing tools are used to form patterned layers of silicon, silicon compounds and metals on the wafer to define the individual IC devices. Metrology tools are used for performing various tests on wafers to ensure the wafers are fabricated to specification. Carrier cleaning tools are used to periodically clean the interior surfaces of a carrier to remove particulates and contaminants that accumulate within a carrier with use. Another tool found in a wafer fab is a sorter, which performs various functions including the transfer of wafers between the various carriers positioned on the wafer sorter, the mapping of wafer location within a carrier cassette, and wafer identification.

In order to transfer wafers between a SMIF carrier and the various tools within a wafer fab, a carrier is typically loaded either manually or automatedly onto a load port assembly on a front of the tool. Each load port assembly includes an access port which, in the absence of a carrier, is covered by a port door. The SMIF carrier is seated on the load port so that the carrier door and port door lie juxtaposed to each other. In a front opening system, the carrier is seated on a carrier advance plate which advances the carrier to the port so that the respective carrier and port doors lie adjacent to each other. Registration pins are provided on the port door that mate with grooves in the carrier door to assure a proper alignment of the carrier door with respect to the port door.

Once the carrier is positioned against the port door, mechanisms within the port door unlatch the carrier door from the carrier shell and move the carrier door and port door together into the process tool where the doors are then stowed away from the wafer transfer path. The carrier shell remains in proximity to the interface port so as to maintain a clean environment including the interior of the process tool and the carrier shell around the wafers. A wafer handling robot within the process tool may thereafter access particular wafers supported in the carrier for transfer between the carrier and the process tool.

Wafer carriers are manufactured to relatively narrow tolerances and are tested prior to initial use within a wafer fab to ensure they have been manufactured to specifications. However, carriers are subject to wear, deformation, breakage and improper maintenance in use, and several performance characteristics of each carrier should be monitored over the life of the carrier as it transports various wafer lots around the fab. These performance characteristics which should be monitored include the following:

Seal Performance

One or more elastomeric seals are provided between the carrier shell and the carrier door to prevent fluids from traveling into or out of the carrier when the door is sealed within the shell. These elastomeric seals wear over time and gradually become less effective in isolating the environment within the carrier from the environment surrounding the carrier.

Seal performance refers to how effective an elastomeric seal in a carrier is at a given point in the life of a carrier at preventing fluid flow around the seal between the carrier shell and carrier door.

Cleanliness

Cleanliness relates to the amount of contaminants found within a carrier at a given time. Contaminants may be grouped into two classes, and there are different removal and monitoring systems for each. The first type of contaminant includes relatively large particles, for example bigger than $0.02\mu$, which adhere to surfaces within the carrier. These particles are generally removed by injecting a cleaning solution onto the surfaces of the carrier to flush away the particles. A second type of contaminant relates to relatively small particles, for example smaller than $0.02\mu$. These particles may be airborne or adhered to surfaces. Such smaller particles may be removed by including a particle filter within the carrier, which removes particles that come into contact with the filter as they float around the interior of the carrier. These small particle contaminants are also removed from surfaces by the cleaning solution injected into the carrier.

Sources of contaminants within a carrier include worn elastomeric seals in a wafer carrier, fluids injected into the carrier and instances where the carrier is opened for maintenance or other purposes. As indicated above, it is important to monitor the cleanliness of the interior of a carrier, as particles can interfere with the device geometries formed on the wafers.

Relative Humidity

Wafer carriers are formed of various materials including plastics such as polycarbonate which absorb moisture. Thus, after a carrier is cleaned with a wet cleaning solution, it is common for the carrier to have a higher relative humidity than ambient for days after the cleaning. Humidity within a carrier can be a significant source of damage to a semiconductor wafer.

Wafer Height

It is important that wafers within a carrier be located at a known elevation relative to the load port and tool on which the carrier is loaded so that a wafer handling robot can cleanly lift a wafer off of a particular shelf and return a wafer to a particular shelf without unintended contact with the wafer. However, over time, factors such as carrier deformation, damage during use, improper maintenance and/or being manufactured outside of specifications can alter the height at which the shelves in the carrier are positioned relative to the load port. It is therefore desirable to check the position of the wafer support shelves within a carrier when a carrier is loaded onto a load port.

Carrier Latching Force

In a front opening interface, in order to couple a carrier door and carrier shell together, a mechanism in the port door rotates a pair of hubs in the carrier door, which in turn cause latch plates to extend into slots in the carrier shell. The latch plates also exert a force on the carrier shell so that the carrier door and shell are pulled tightly together. The same is true for bottom opening systems, but such systems typically include a single, central hub.

Front opening carriers further include a spring loaded mechanism for biasing wafers toward a rear of the carrier (i.e., away from the carrier door). Lying in contact with the edges of the wafers within the carrier, the spring loaded mechanism exerts an approximate 40 newton force against the carrier door. This force in turn generates an additional force by the latch plates against the carrier shell.

The force between the latch plates and carrier shell, and consequently the torque required to rotate the hubs in order to actuate the latch plates, can vary over time. It is important to monitor this force, as significant variations can affect the ability of the port door to couple and uncouple the carrier door and shell.

Electrostatic Neutralization

Electrostatic build up on and discharge from wafers can damage or destroy the wafers. Concern over electrostatic damage has been increasing in recent years as device geometries get finer and the requirements for reliability become more stringent. In conventional carriers, it is known to provide a conductive path away from the top and/or bottom surface of the wafer to neutralize electrostatic charge on the wafers. Conductive coatings provided for neutralizing the static charge may wear over time. Moreover, carriers may break, or a conductive pathway may be broken if a carrier is reassembled incorrectly during maintenance. It is therefore desirable to monitor the ability of a carrier to neutralize static electric charge.

Carrier Configuration Detector

A bottom surface of a carrier is generally provided with four designated positions at which wells may be formed. Similarly, the surface supporting a carrier at a load port assembly includes four corresponding positions at which pins may be provided. These wells on the bottom of a carrier can be used to define the type of carrier and/or the type of process for which the carrier is intended. For example, wafer fabs are often broken down into zones for different fabrication processes, and carriers for one zone should not be used in other zones. In this instance, wells could be provided in the various positions on the bottom of the carrier to designate a carrier for a particular zone. In practice, where a carrier is used in a proper zone, the well(s) on the bottom of the carrier match up with the pin(s) on the load port, and the carrier seats properly on the load port. On the other hand, where a carrier designated for one zone is used in another, incompatible zone, the well(s) in the bottom of the carrier would not match up with the pin(s) on the load port, and the carrier would not seat properly on the load port.

The well(s) on the bottom of a carrier can be used to designate and distinguish a carrier between a variety of other classifications, such as for example designating a carrier as a 25 wafer carrier versus a 13 wafer carrier; an enclosed SMIF carrier versus an open cassette; a carrier supporting 300 mm wafers versus a carrier supporting 200 mm wafers, etc. In each instance, the pins on a load port will ensure that a carrier will only seat on a load port which is designated to receive that type of carrier.

It is also known to provide a sensor within a well which generates a signal when a pin seats within that well. Such a system provides feedback as to whether the sensors on the bottom of a carrier in fact match up with pins on the load port assembly. This system provides an additional advantage that the sensors can distinguish between a greater number of pin configurations on a load port, and hence a greater number of different carrier configurations and processes, than can the wells by themselves.

It would be advantageous to monitor situations where a carrier is placed on a compatible load port and situations where a carrier is placed on an incompatible load port, as well as the frequency of both situations.

In addition to collecting data with regard to each of the above-described performance characteristics of the carrier, it would be useful to accumulate and analyze this data to improve and optimize management of carrier operations throughout the wafer fab. For example, this data could be used to analyze how various performance characteristics of the carrier population change overtime. This data can then be used to manage and maintain the carrier population in an efficient manner, and also identify when a carrier needs to be replaced.

SUMMARY OF THE INVENTION

It is therefore an advantage of the present invention to provide a smart load port for capturing data relating to a plurality of carrier and load port performance characteristics.

It is a further advantage of the present invention to store the data on a central server for use in managing carrier operation within the wafer fab.

It is a further advantage of the present invention to measure several performance characteristics without impacting throughput of wafers on a tool.

It is a further advantage of the present invention to ensure that carriers are being cleaned properly and with the proper frequency.

It is another advantage of the present invention to provide a system which identifies when carrier seals begin to fail and when the seals need to be replaced.

It is a further advantage of the present invention to identify the relative humidity within a carrier at a given time and to determine how carriers dry over time.

It is a further advantage of the present invention to provide physical information pads to prevent location of a carrier designated for one type of process on a load port for performing another, incompatible process.

It is a still further advantage of the present invention to ensure that wafer heights are within standard specifications.

These and other advantages are provided by the present invention which in preferred embodiments relates to a system capable of monitoring a plurality of performance characteristics of a wafer carrier on a load port, and to a system for managing carrier operation on a fab-wide basis. In particular, several detector and measurement systems are built into or associated with the load port assembly. These detector and measurement systems include a torque measurement system, a wafer height measurement system, a carrier identification reader, an information pad, a resistivity measurement system, a cleanliness measurement system, a seal performance detector and a relative humidity detector. These monitoring systems can be provided on load ports associated with various tools, such as processing tools, metrology tools, carrier cleaning tools and sorters, to gather data relating to individual carriers and the carrier population as a whole.

In accordance with further principals of the present invention, the data gathered by the various measuring and detecting systems within the load port assembly can be used to manage the carrier population within the fab. For example, by monitoring a performance characteristic over time, across the entire carrier population in the wafer fab, the average change in that performance characteristic over time may be accurately mapped for the population in general. The standard deviation for the carrier population with respect to that performance characteristic over time may also be determined and stored.

This stored information can be used to provide valuable forecasting information, which may be printed in report form, as to when the average carrier or carrier subsystem would generally require maintenance or replacement. This information can also be used to identify carriers which are broken, have failed, or which are performing outside of acceptable ranges for carriers of comparable age. Moreover, the entire history of a carrier, for each of the performance characteristics, can be stored. This promotes optimal carrier management efficiency in that the optimal average timing for maintenance and/or replacement of carriers is known. Moreover, defective carriers may be quickly identified and removed from the carrier population.

BRIEF DESCRIPTION OF THE DRAWINGS

The invention will now be described with reference to the drawings, in which:

FIG. 1 is a rear perspective view of a carrier for use with the present invention;

FIG. 2 is a front perspective view of a load port assembly including a plurality of monitoring systems according to the present invention;

DETAILED DESCRIPTION

Figure 3A:
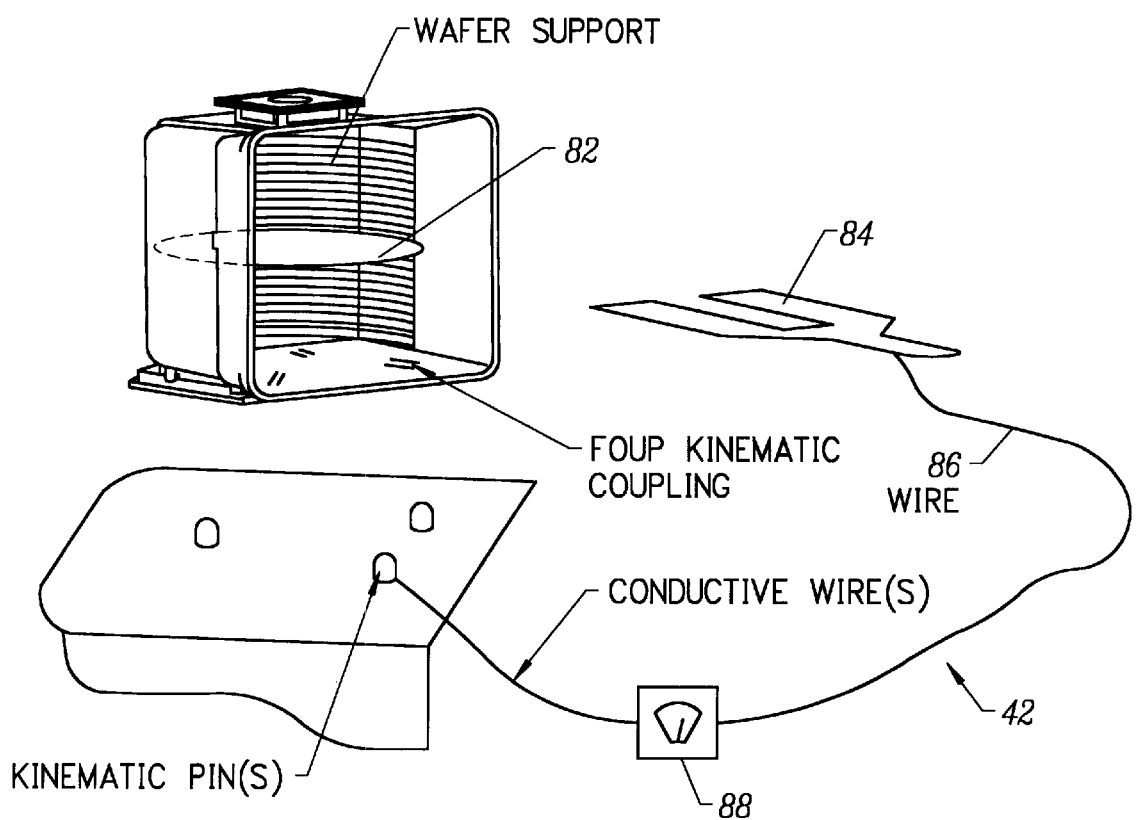
FIG. 3A is a schematic representation of a preferred embodiment of a static neutralization system according to the present invention.
Figure 3B:
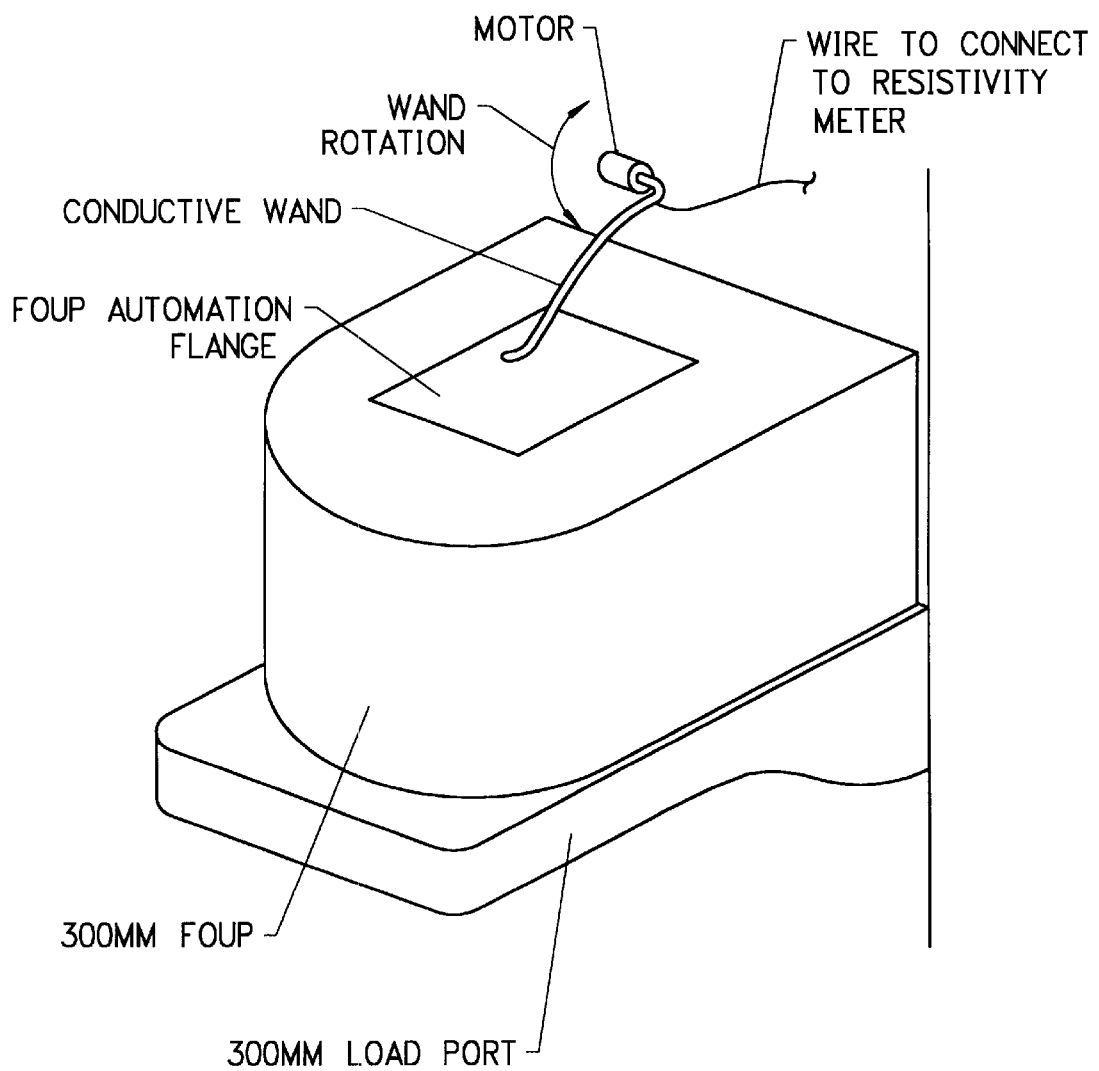
FIG. 3B is a schematic representation of a further aspect of the preferred embodiment of the static neutralization system according to the present invention.

The present invention will now be described with reference to FIGS. 1–9, which in preferred embodiments relate to a system capable of monitoring a plurality of performance characteristics of a wafer carrier, and to a system for managing carrier operation on a fab-wide basis. While a monitoring system described hereinafter is shown with respect to a front opening interface load port used with a front opening unified pod ("FOUP"), it is understood that the monitoring and management system according to the present invention may alternatively be used with a bottom opening interface used with bottom opening carriers. Moreover, while a carrier for 300 mm wafers is shown, it is understood that the size of the carrier is not critical to the present invention, and that the present invention may be used with carriers of various sizes including those adapted to transport 200 mm and 150 mm wafers.

It is further understood that preferred embodiments of the present invention utilize SMIF technology, and comply with and allow compliance with Semiconductor Equipment and Materials International ("SEMI") standards. However, alternative embodiments of the present invention need not operate with SMIF technology and need not comply with SEMI standards.

Referring now to FIG. 1, there is shown a perspective view of a carrier 20 in the form of a 300 mm FOUP including a carrier door 22 mating with a carrier shell 24 to define a sealed environment for one or more workpieces located therein. While carrier 20 is illustrated as a 300 mm front opening carrier, as previously indicated, the size and type of the carrier are not critical to the present invention. Referring to FIGS. 1 and 2, in order to transfer the workpieces between the carrier 20 and a tool 28, the carrier is loaded onto a load port assembly 25 adjacent a port door 26 on a front of the tool. Tool 28 may be any of a variety of tools in a wafer fab including a process tool, a metrology tool, a carrier cleaning tool and/or a sorter.

The carrier is loaded so that a rear surface 31 of the carrier door 22 faces a front surface 30 of the port door 26. The port door includes a pair of latch keys 32 for being received in a corresponding pair of slots 33 of a door latching assembly mounted within carrier door 22. An example of a door latch assembly within a carrier door adapted to receive and operate with latch keys 32 is disclosed in U.S. Pat. No. 4,995,430 entitled "Sealable Transportable Container Having Improved Latch Mechanism", to Bonora et al., which patent is assigned to the owner of the present invention, and which patent is incorporated by reference herein in its entirety.

In order to latch the carrier door to the port door, the carrier 20 is manually or automatedly seated on a carrier advance plate 27. The carrier advance plate 27 typically includes three kinematic pins 29, or some other registration feature, which mate within corresponding slots on the bottom surface of the carrier to define a fixed and repeatable position of the bottom surface of the carrier on the advance plate and load port assembly. The carrier advance plate 27 is translationally mounted to advance the carrier toward and away from the port door. Once a carrier is detected on the carrier advance plate by sensors in the load port assembly, the carrier is advanced toward the load port until the rear surface 31 of the carrier door 22 lies in contact with the front surface 30 of the port door 26.

In addition to decoupling the carrier door from the carrier shell, rotation of the latch keys 32 will also lock the keys into their respective slots 33, thus coupling the carrier door to the port door.

While a preferred embodiment of the door latch assembly in the carrier door has been described above, it is understood that the mechanisms in the carrier door for coupling/uncoupling the carrier door to the carrier shell are not critical to the present invention and may vary significantly in alternative embodiments.

Load port assembly 25 further includes a plurality of monitoring systems for monitoring a plurality of performance characteristics of carrier 20 and/or load port assembly 25. These systems include a torque measurement system 38, a wafer height measurement system 40, a carrier identification reader 42, a carrier configuration detector 44, a resistivity measurement system 46, a cleanliness measurement system 48, a seal performance detector 50, and a relative humidity detector 52. Each of these measurement systems and detectors are shown in FIG. 2, schematically or otherwise, and described in greater detail below. In addition to performance characteristic monitoring systems, the load port assembly 25 further includes a graphical user interface for user input and system feedback.

Torque Measurement System

As discussed in the Background of the Invention section, it is desirable to measure the amount of torque required to rotate the pair of latching hubs to thereby couple and decouple the carrier door and shell. If the torque is too high, this can interfere with proper opening and closing of the carrier 20. The present invention therefore includes a torque measurement system 38 mounted to one or both of the latch keys 32. The torque measurement system may be mounted on the back side of the port door, and may include any of various known mechanisms for measuring the torque exerted by and/or on a rotating object such as the latching hubs.

The torque measurement system may be included on load ports at various tools, including for example processing tools, metrology tools, wafer cleaning tools and sorters.

Wafer Height Measurement System

It is desirable to measure the height of the wafer support shelves (not shown) within carrier 20 relative to registration pins 29. If a carrier is improperly manufactured, or where a carrier 20 has become deformed, the height of the shelves and wafers will vary from the anticipated height. This variance may result in undesired contact between a wafer and a wafer handling robot upon removal of the wafer from the carrier and/or undesired contact between the wafer and the shelf upon return of the wafer to the carrier.

As such, the present invention includes the wafer height measurement system 40 for measuring the height of the wafers within the carrier 20 relative to the registration pins 29 on which the carrier 20 is supported. The wafer height measurement system may comprise any of various known wafer mapping systems, such as for example that disclosed in U.S. patent application Ser. No. 09/173,710 entitled "Wafer Mapping System" to Rosenquist, et al., which application is assigned to the owner of the present invention and which application is incorporated by reference herein in its entirety.

Figure 4:
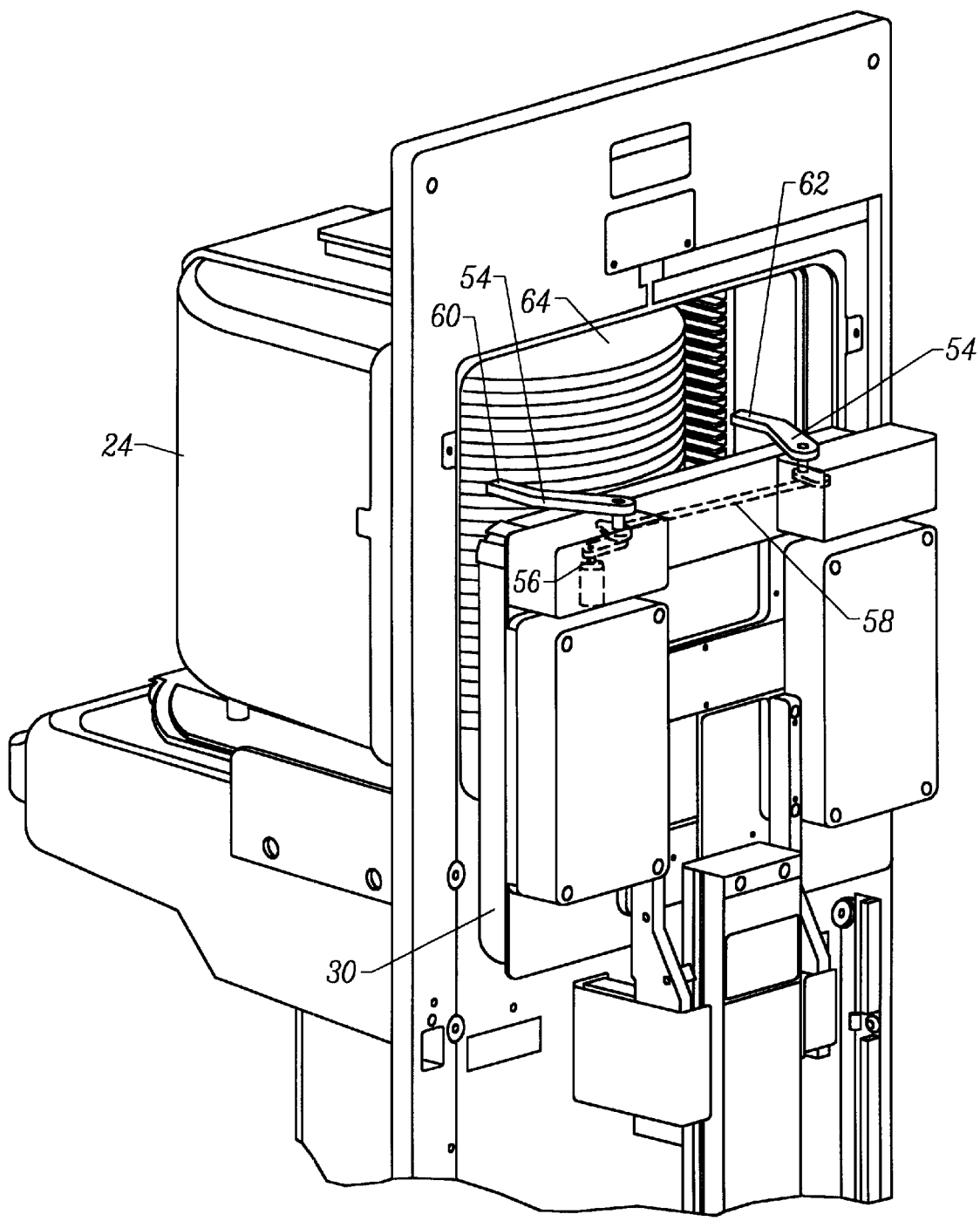
FIG. 4 is a perspective view of a height measurement system according to the present invention.

As disclosed in the incorporated reference and as shown in FIG. 4 of the present invention, one embodiment of the wafer height measuring system detects wafer height position as the port door 26 is lowered away from the access port of tool 28 in order to allow wafer transfer through the port. According to the embodiment shown in FIG. 4, the wafer height measurement system 40 includes a pair of fingers 54 rotatably mounted to the top of the port door. In a retracted position, the fingers lie above and behind the port door. However, once the port door is lowered sufficiently to avoid contact between the fingers and the carrier shell, the fingers are rotated to their extended position into the carrier shell via a motor 56 and actuation assembly 58.

The wafer height measuring system 40 further includes a transmitter and receiver 60 and 62 either mounted in the port door or at the ends of the fingers (as shown in FIG. 4). In their extended position, the fingers transmit a beam of electromagnetic energy from the transmitter across a front of the carrier shell to the receiver. As the port door and wafer height measuring system move downward, the wafers 64 within the carrier will break the beam and prevent receipt of the beam in the receiver. At this time, the elevation of the wafer will match the known elevation of the beam so that the position of the wafer at this point may be measured and mapped in memory. The duration of time the beam is blocked may also identify a cross-slotted and double-slotted wafer.

In the embodiment shown in FIG. 4, the fingers are provided to detect the position of wafers 64 seated on shelves within the carrier shell 24. As would be appreciated by those of skill in the art, the position and configuration of fingers 54 may be altered, depending on the carrier configuration, so as to instead detect the position of a shelf within the carrier 24. Thus, the height of shelves not including a wafer 64 may also be detected. As would be appreciated by those of skill in the art, a wide variety of other wafer height measuring systems of known construction may be employed to detect the height of a wafer and/or wafer shelf within carrier shell 24.

In a preferred embodiment, the wafer height measuring system 40 may be employed on a tool 28 such as processing tools, metrology tools, carrier cleaning tools, and sorters so as to determine the height of the wafers and/or shelves within the wafer carrier.

Carrier Identification Reader

Carrier identification reader 42 is mounted on load port assembly 25 so as to scan, read or otherwise identify a unique identification mark associated with each carrier 20. Carrier identification mark and identification reader systems are well known in the art and comprise, for example, a bar code on carrier 20 and a bar code reader mounted on the load port. It is further understood that the carrier identification reader 42 may be located remotely from load port assembly 25. In such an embodiment, the identification of a particular carrier on a particular load port assembly is transmitted to a remote receiver which identifies the mark and confirms that particular carrier is appropriate for that particular load port. Such a system includes an RF pill mounted on the carrier, which pill includes a transponder for transmitting information relating to the carrier and/or wafers contained therein to a storage and control system. Such RF pills, and the systems making use thereof, are described for example in U.S. Pat. Nos. 4,827,110 and 4,888,473 to Rossi, et al., and U.S. Pat. No. 5,339,074 to Shindley. The carrier may alternatively include an IR tag. Such IR tags, and systems making use thereof, are described for example in U.S. Pat. Nos. 5,097, 421, 4,974,166 and 5,166,884 to Maney, et al. Each of the above-identified patents is assigned to the owner of the present invention and each is incorporated by reference in its entirety herein. As would be appreciated by those of skill in the art, other known carrier and/or wafer identification and identification reader systems may be used in the present invention to indicate that a particular carrier 20 is properly seated on a particular load port assembly 25.

The carrier identification reader 42 as described above may be used on various tools 28 including for example processing tools, metrology tools, carrier cleaning tools, and sorters.

Carrier Configuration Detector

Figure 9:
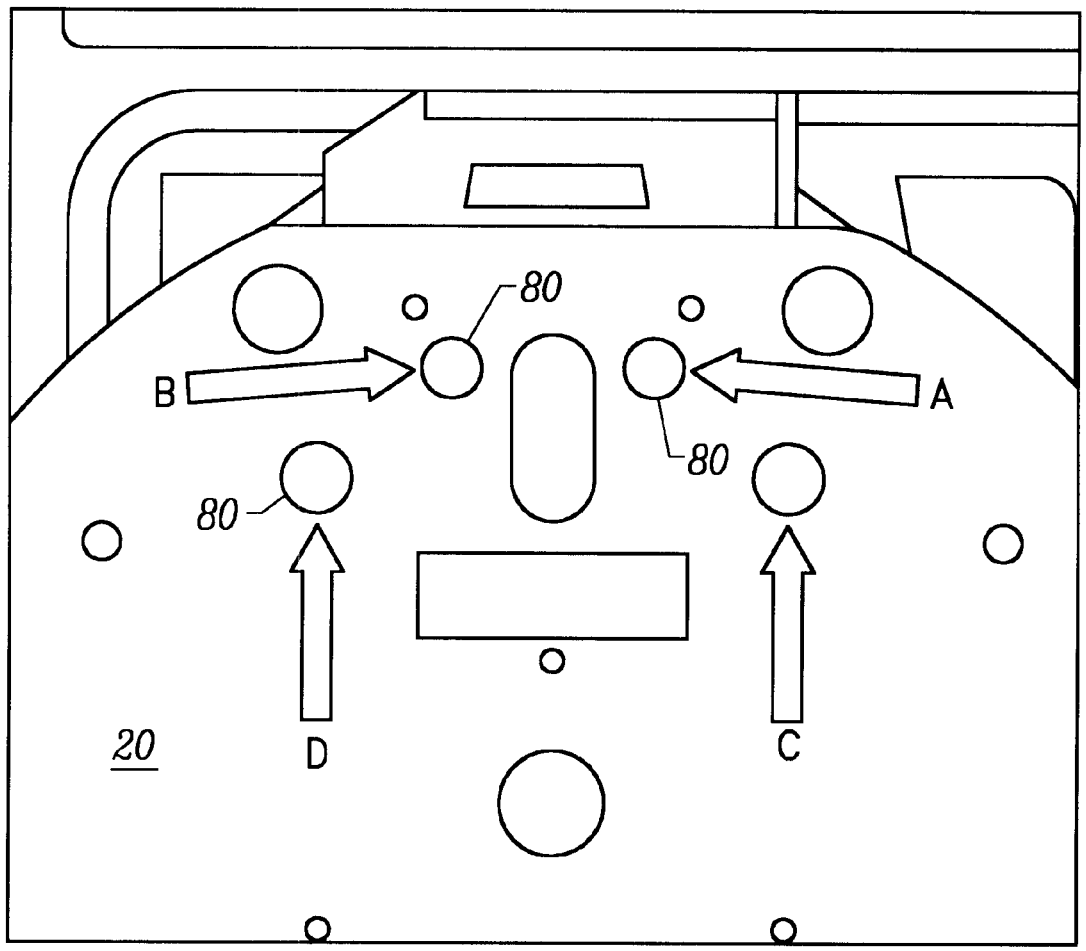
FIG. 9 is an illustration of a bottom of a carrier including a well configuration for designating the carrier for a particular process.

As discussed in the Background section, it is a conventional protocol to make use of wells or sensors on the bottom of a carrier and information pads, such as for example pins, on a carrier advance plate to ensure that when a carrier is placed on a load port, that carrier is in fact compatible with that load port. As an example, carriers that are used to transport wafers to and from a process tool performing a copper deposition step must not also be used on process tools performing gate oxidation, or many other process steps. If the carrier used in the copper process were also used in a gate oxidation process, the copper may chemically react and cross-contamination within the container may occur. Thus, carriers designated for copper deposition processes include a well configuration on their bottom surface including a plurality of wells 80 such as for example shown in FIG. 9 that will seat on load ports that are compatible with copper deposition processes, but will not seat on load ports that are incompatible with copper deposition processes. As shown in FIG. 9, a well 80 is provided at positions A, B and D, but not at position C.

Ideally, the carrier identification reader 42 prevents the use of carriers on incompatible processes. However, in order to provide redundancy, the well—pin protocol may also used.

In accordance with the present invention, sensors may be provided within the wells on the bottom of the carrier to generate feedback as to when a carrier is seated on a compatible load port, and may also generate feedback as to when a carrier is seated on an incompatible load port. Namely, where all of the number and location of pins match the number and location of sensors in the wells, feedback is generated to indicate that the carrier is compatible with that load port. On the other hand, where either the number or position of the pins do not match the number or position of the sensors in the wells, feedback is generated to indicate that the carrier is incompatible with that load port.

In addition to providing such feedback, the sensors may physically block a pin from seating in a well where the pin—well configurations are not compatible. Thus, the system according to the present invention both blocks a carrier from properly seating on an incompatible load port and provides sensory feedback as to the incompatibility. The sensors of the prior art did not physically block a carrier from seating on an incompatible load port.

It is understood that the various well configurations on the bottom of a carrier can be formed by fabricating a carrier with four wells and then plugging select wells to designate a carrier for a particular configuration. This provides an advantage in that a carrier can be configurable by the wafer manufacturer. Alternatively, the different well configurations can be formed during the injection molding process when the bottom plate of the carrier is formed.

As would be appreciated by those of skill in the art, the compatibility detector 44 on load port 25 may take on a wide variety of configurations to designate a wide variety of compatibility protocols, especially where the protocol involves sensors in the wells in the bottom of a carrier. Moreover, the information pads of compatibility detector 44 can take on a wide variety of shapes other than pins, which shapes generally correspond to the shape of a recessed portion in the bottom of a carrier.

Seal Performance Detector

As indicated in the Background of the Invention section, it is desirable to be able to test the effectiveness of the elastomeric seal between the carrier door and the carrier shell when the carrier is sealed. As such, in accordance with a further aspect of the present invention shown in FIG. 5, a load port assembly 25 in accordance with the present invention may further include a seal performance detector 50. The seal performance detector 50 is preferably used with a load port including an inlet opening 70 and an outlet opening 72 formed in the carrier advance plate 27 as shown for example in FIG. 2. In such an embodiment, the carrier 20 may include inlet and outlet valves (not shown) of known construction which seat on top of inlet 70 and outlet 72, respectively, when carrier 20 is seated on load port assembly 25.

Which such a construction, a fluid may be injected into carrier 20 through inlet opening 70 and the inlet valve and may be drawn from the carrier 20 through the outlet valve and outlet opening 72. The inlet and outlet openings may further include a seal to facilitate fluid flow from the inlet opening through the carrier and out the outlet opening. Such seals, and the valves provided in the carrier, are shown for example in U.S. Pat. No. 6,056,026 entitled "Passively Activated Valve For Carrier Purging" to Fosnight, et al., which patent is assigned to the owner of the present invention and which patent is incorporated by reference herein in its entirety.

Figure 5:
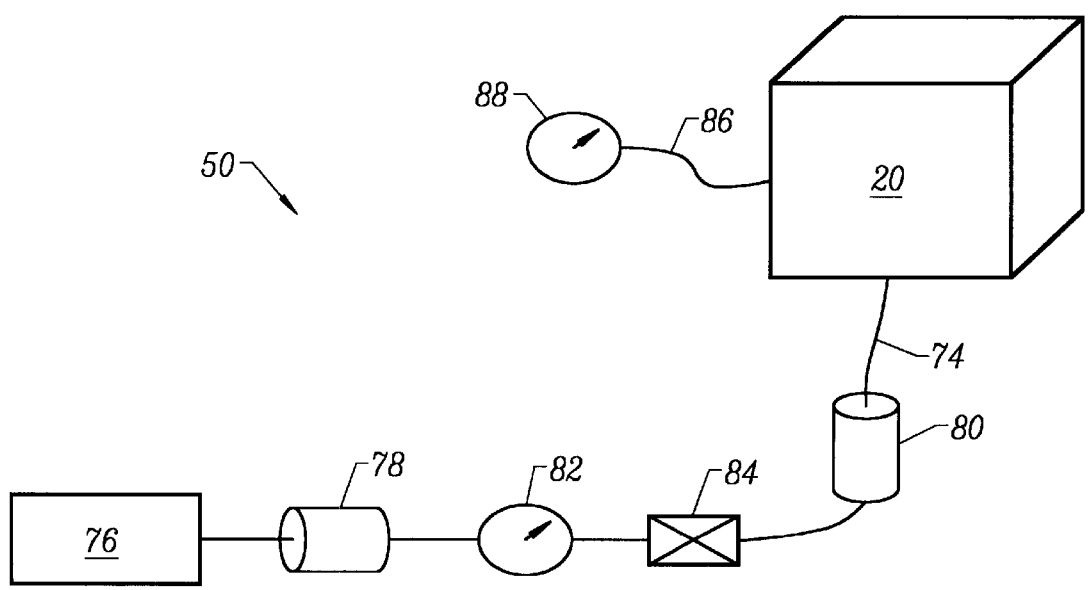
FIG. 5 is a schematic representation of a seal performance detector system according to the present invention.

FIG. 5 is a schematic representation of the seal performance detector 50 for use in accordance with the present invention. The seal performance detector 50 includes a flexible inlet hose 74 affixed to the inlet 70 through the carrier advance plate for supplying a flow of ultraclean air or nitrogen from a house supply 76 located adjacent to or remote from load port assembly 25. In a preferred embodiment, fluid from house supply 76 is filtered through first and second filters 78 and 80 prior to entering carrier 20. Filters 78 and 80 may be chemical and/or HEPA filters. Seal performance detector 50 further includes a flow meter 82 for measuring a flow rate of fluid into carrier 20, and a valve 84 for controlling the fluid flow rate into carrier 20. Seal performance detector 50 further includes a flexible outlet hose 86 affixed to outlet opening 72 through the carrier advance plate, and a pressure gauge 88 mounted adjacent to or remote from load port assembly 25.

In one embodiment of operation, the seal performance detector performs in two different modes: one where there is a high leak rate around the seal and one where there is a low leak rate around the seal. For both, fluid is initially injected into the carrier through the inlet hose 74 and inlet 70 at a constant rate. As the pressure within the carrier increases, the pressure measured by gauge 88 will similarly increase. Where there is a high leak rate around the seal, as the pressure increases, the amount of fluid escaping around the seal will quickly equal the amount of fluid injected into the carrier. When this point is reached, the pressure gauge will read a constant pressure. The point at which the pressure gauge remains constant is then recorded for that carrier.

Where a seal is performing well, and there is a low leak rate, the pressure in the carrier will continue to rise upon the constant flow rate of fluid into the carrier through inlet 70. In order to prevent a situation where the pressure within a carrier would exceeds a pressure within the carrier during normal operation, when the pressure exceeds a predetermined reference pressure, the flow rate of fluid into the carrier is then decreased. As the flow rate of fluid into the carrier is decreased, at some point, the flow rate into the carrier will equal the flow rate around the seal. At this point, the pressure gauge will read a constant pressure. The point at which the pressure gauge remains constant is then recorded for that carrier.

It is understood that other known methods may be used to measure the leak rate around a seal in alternative embodiments.

Using the seal performance detector 50 on a regular basis will indicate how the elastomeric seal wears over time. Additionally, leak rates over predetermined levels, for example 3.5 liters per second, may indicate that the seal needs to be replaced.

Seal performance detector 50 may be used on various tools 28 including for example metrology tools, carrier cleaning tools, and sorters. Additionally, detector 50 could be utilized on stand alone purging stations as well as storage shelves within a stocker.

Relative Humidity Detector

Figure 6:
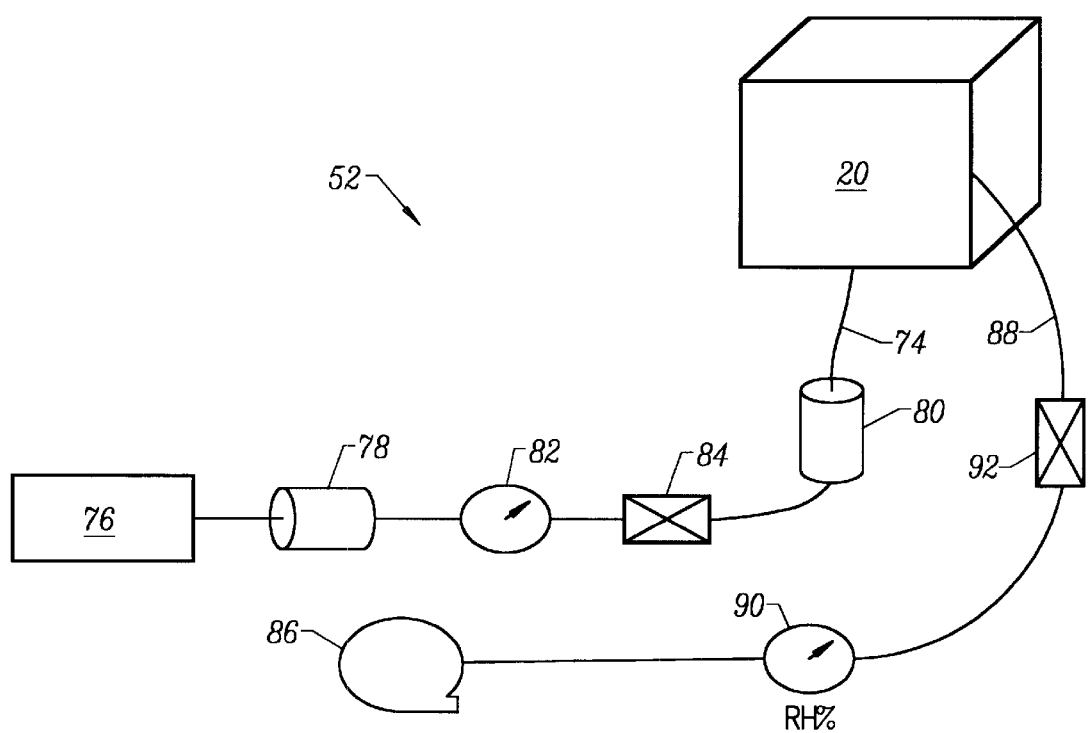
FIG. 6 is a schematic representation of a relative humidity detector system according to the present invention.

The relative humidity detector 52 will now be described with reference to the schematic illustration of FIG. 6. Detector 52 can make use of the flexible hose 74, the source 76, the filters 78 and 80, the flow meter 82 and the valve 84 used by the seal performance detector 50 and connected to inlet 70 on load port assembly 25. For this embodiment, house supply 76 preferably provides dry air with either no moisture content, or a low, known moisture content. Relative humidity detector 52 further includes a vacuum pump 86 affixed to outlet 72 in the load port assembly 25 via a flexible hose 88. It is understood that vacuum pump 86 may be omitted in alternative embodiments. Detector 52 also includes a meter such as a barometer 90 for measuring the relative humidity of the fluid drawn from the carrier 20 through hose 88, and a valve 92 for controlling the flow of the fluid drawn from the carrier. By injecting a known volume of dry gas of known relative humidity into carrier 20, and measuring the relative humidity of the volume of gas purged from the carrier, the relative humidity within the carrier may be determined.

Relative humidity detector 52 may be used on various tools 28 including for example metrology tools, carrier cleaning tools, and sorters. Additionally, detector 52 could be utilized on stand alone purging stations as well as storage shelves within a stocker. Where the relative humidity detector 52 is used on high throughput tools, it is used substantially as a measurement device. However, where the detector 52 is used on a testing device, where a carrier may remain for prolonged periods, the detector 52 may also be used a conditioning device which actually removes humidity from a carrier. In this instance, the detector can map how humidity within a carrier changes over time, which information can be stored for later use.

Static Neutralization Measurement System

A ground path circuit is provided to neutralize electric charge from the wafers. In particular, in one carrier configuration for carriers seated on a load port, an electric path from the wafers is provided through the wafer support shelf, through the carrier shell, to the handle on top of the carrier. The carrier handle is in turn electrically coupled to the kinematic plate which rests atop the electrically grounded registration pins on the load port assembly. It is also desirable to neutralize static charge where a carrier is being transported by an overhead transport system which grips the carrier by the handle. In this instance, the ground path circuit is as described above, but the charge is neutralized through the overhead transport in contact with the handle. It is understood that a carrier may include other ground paths.

The static neutralization measurement system 46 is provided to test the ability of a carrier to neutralize static buildup. In one embodiment (FIG. 3A), the system 46 measures resistance by passing a known current from a known voltage source through a path and testing the resulting resistivity. If the resistivity is too high, or if there is no current flow, the carrier needs to be repaired or replaced. The static neutralization measurement system in this embodiment includes a dummy wafer 82 supported on an end effector 84 of a wafer handling robot or seated within the carrier 20 (as shown). The wafer handling robot is connected to a current source via wire 86 and provides the current to the dummy wafer. The wafers being processed are preferably removed from a carrier, and the dummy wafer is inserted into the carrier. The current from the dummy wafer is then passed through the ground path circuit. In one embodiment emulating a carrier on a load port, the current is passed through the registration pins and the resistance is measured by, for example, an ohmmeter 88.

In another embodiment emulating a carrier being transported on an overhead transport system (FIG. 3B), an arm can be provided which contacts the handle so that the current is passed through the handle to the arm and measured.

It is understood that other known systems may be used to measure the ability of a carrier to neutralize static electric charge. Such other known systems include a charge plate on the load port which charges a carrier with a current and measures how long it takes to dissipate the charge. It is also understood that the measurement system 42 may measure other electrical properties of a carrier. For example, it may be that a carrier acts as a Faraday cage. In this instance, the effectiveness of the Faraday cage can be measured by the system 42.

In embodiments where the system measures resistance, resistance can be measured by a conventional resistance measuring device such as an ohmmeter included in the circuit. The change in the measured resistance for a carrier over time can be stored, and carriers having a resistance that is too high or no current flow can be replaced or repaired. Similarly, where the static neutralization measurement system 46 measures static neutralization by other methods, these measurements are taken over time and stored, and if the measurement indicates that static neutralization from the carrier is poor or nonexistent, the carrier can be repaired or replaced.

The static neutralization measurement system 46 may be used on various tools 28 including for example metrology tools and sorters.

Cleanliness Measurement System

Cleanliness measurement system 48 may in fact comprise two separate cleanliness measurement subsystems. The first subsystem measures relatively large particles. In general, these particles may be removed by a carrier cleaning system, such as for example that disclosed in U.S. Pat. No. 5,846,338, entitled "Method And Apparatus For Dry Cleaning Room Containers" issued Dec. 8, 1998, which patent is assigned to the owner of the present invention, and which patent is incorporated by reference herein in its entirety. That patent discloses using an ultraclean $CO_2$ aerosol or ionized nitrogen gas sprayed onto the interior surfaces of a carrier to remove contaminants from those surfaces. The contaminant cleanliness measurement subsystem may operate by collecting the aerosol or gas after it has been sprayed into the carrier, and performing a particle analysis to identify and quantify the amount of particles found in the aerosol or gas. The analysis may be performed remote from the load port, but the carrier from which the aerosol or gas was taken is noted, and the results of the analysis are later linked to the carrier from which the aerosol was taken.

It is understood that the contaminant cleanliness measurement subsystem for detecting relatively large particles may operate in conjunction with various other cleaning systems, wet or dry, with the cleaning solution being analyzed after it has removed particulates and contaminants from the interior carrier surfaces.

The cleanliness measurement system 48 further includes a subsystem for measuring relatively small particles, such as airborne molecular contaminants (AMC). It is known to provide mechanisms within a carrier for removing airborne molecular contaminants from the interior of a carrier. Such mechanisms include particle filters which are affixed to a surface within a carrier which capture airborne molecular contaminants as they randomly contact the filter. Such a filter is disclosed for example in U.S. Pat. No. 4,724,874, entitled "Sealable Transportable Container Having A Particle Filtering System" to Parikh et al., which patent is assigned to the owner of the present invention and which patent is incorporated herein by reference. These filters get dirty over time and must be periodically removed and replaced by a new filter. The AMC measurement subsystem may operate in conjunction with the particle filtering system so that when the filter is removed, a chemical analysis may be performed on the filter to determine the identity and quantity of airborne molecular contaminants captured by the filter over a given period of time.

Although not critical to the present invention, in one embodiment, the filter may include a magnet so that the filter may be easily affixed to an interior surface of the carrier, and may be easily removed from the carrier by an end effector including an electromagnet or permanent magnet of sufficient coercivity to overcome the attractive forces of the filter magnet with the carrier surface. Once removed, the end effector may transfer the filter to the AMC measurement subsystem for analysis.

The date, filter identification and carrier from which the filter is removed is stored. Then, after the filter analysis is performed, the analysis is matched with the filter and stored, so that the results may be associated with the carrier from which the filter was taken.

It is understood that various other AMC removal techniques may be used with the AMC measurement subsystem according to the present invention. Moreover, it is understood that a great many other onboard monitoring devices may be provided within the carrier, and removed at a load port for analysis as described above. Such systems include a surface acoustic wave monitor chip, a shock and vibration monitor, a temperature monitor, a humidity monitor, an oxygen monitor and a desicant to name a few.

In accordance with further principals of the present invention, the data gathered by the various measuring and detecting systems associated with the load port assembly 25 can be used to manage the carrier population within the fab. For example, by monitoring a performance characteristic over time, across the entire carrier population in the wafer fab, the average change in that performance characteristic over time may be accurately mapped for the population in general. The standard deviation for the carrier population with respect to that performance characteristic over time may also be determined and stored.

This stored information can be used to provide valuable forecasting information, which may be printed in report form, as to when the average carrier or carrier subsystem would generally require maintenance or replacement. This information can also be used to identify carriers which are broken, have failed, or which are performing outside of acceptable ranges for carriers of comparable age. Moreover, the entire history of a carrier, for each of the performance characteristics, can be stored. This promotes optimal carrier management efficiency in that the optimal average timing for maintenance and/or replacement of carriers is known. Moreover, defective carriers may be quickly identified and removed from the carrier population.

Figure 7:
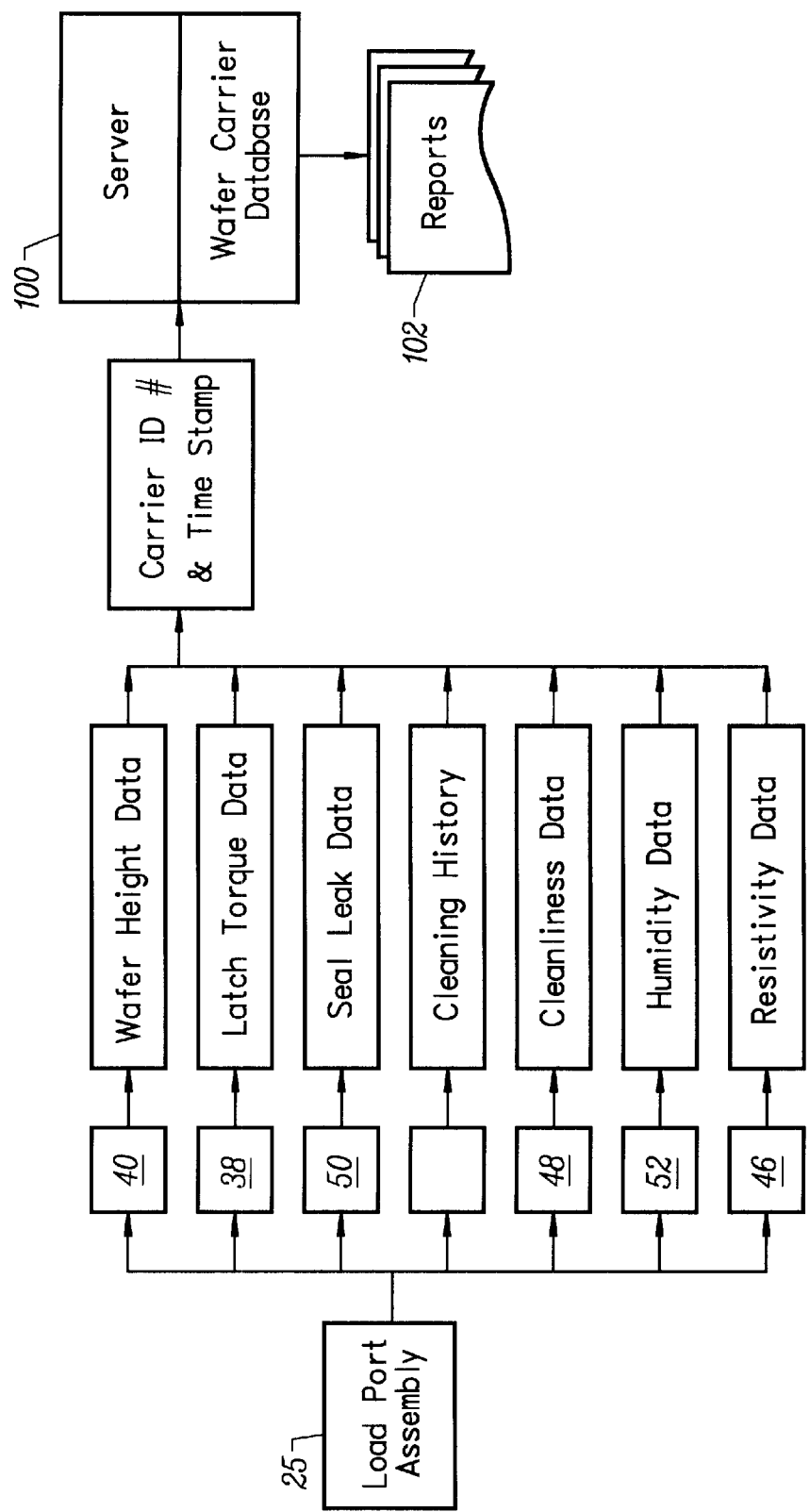
FIG. 7 is a schematic representation of a system architecture according to the present invention.

A system architecture for gathering this information is shown in FIG. 7. As shown therein, the torque measurement system 38, wafer height measurement system 40, resistivity measurement system 46, cleanliness measurement system 48, seal performance detector 50, and a relative humidity detector 52 associated with load port assembly 25 each gather data relating to a particular performance characteristic as described above. Once data is generated for a particular carrier, that data is forwarded, along with the carrier identification and a date and time stamp, to a central server database 100 for the wafer fab. The carrier identification and date/time stamp may be generated by the carrier identification system 42 as described above. It is understood that this data may be for carriers within a particular wafer fab. Alternatively, it is understood that a server may be linked to several wafer fabs to gather information about the various carriers in each fab.

It is further understood that the various detector and measurement systems need not all generate data that is sent to the server 100 at the same time. Data may instead be forwarded to the server 100 with a carrier identification and time stamp from some detector and measurement systems and not others. This occurs for example where a load port is not equipped with all of the above-described measure.

Figure 8B:
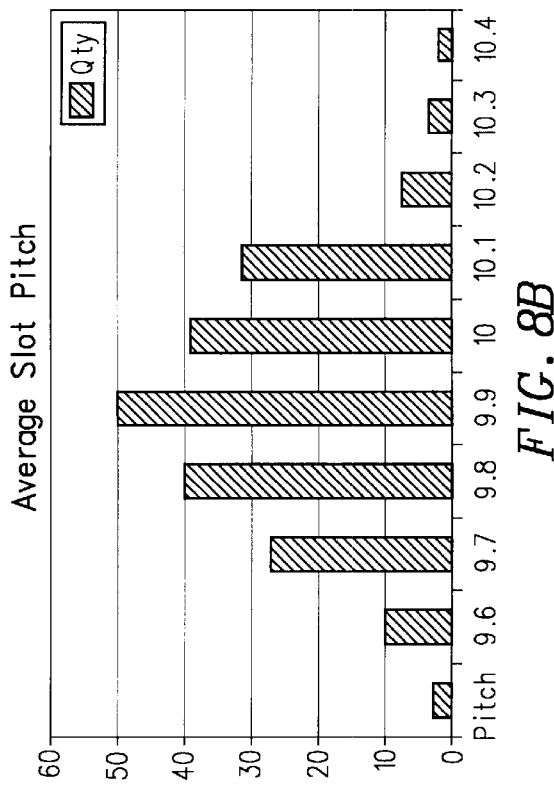
FIG. 8 show sample reports that may generated in accordance with the principles of the present invention.
Figure 8C:
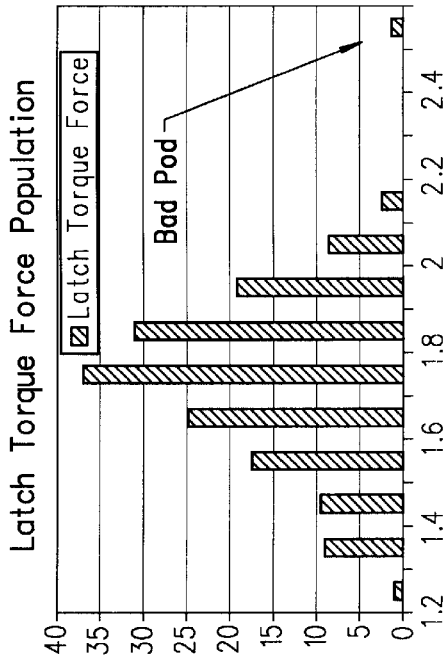
Figure 8A:
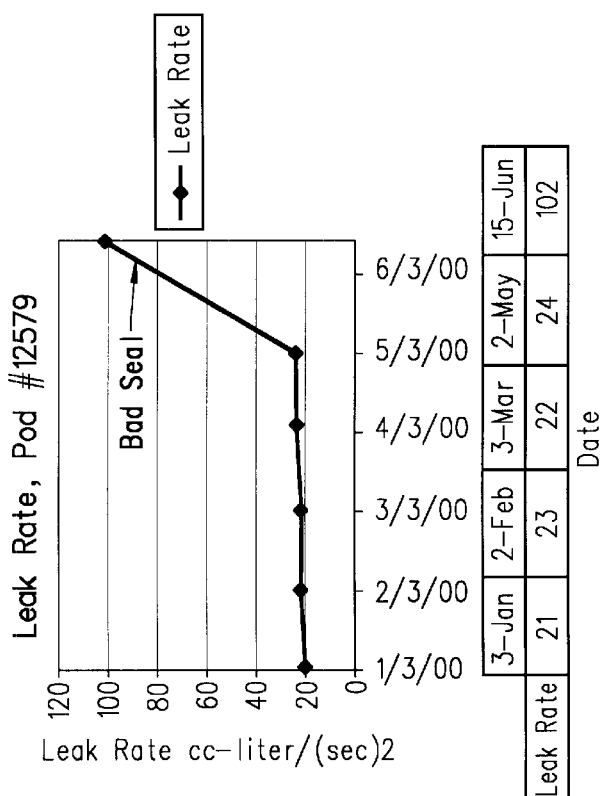

Once data is stored in the database 100, the database can generate a wide variety of reports 102 relating to carrier history, one or more performance characteristics for a particular carrier and/or one or more performance characteristics for the entire carrier population. Database software is well known for taking the data entered from the various monitoring systems and generating the desired reports therefrom. Some sample reports are shown in FIG. 8. A first report 102 shows the seal performance, or leak rate, for a particular carrier, carrier #12579. As shown therein, the seal for carrier 12579 was performing well until June 15, at which time the measured conductance was found to be outside of acceptable limits, thus requiring maintenance or replacement of the carrier. A second report 102 shows average slot pitch between carrier shelves for the population of carriers. The report shows that most carriers (about 50)

have an optimal pitch of about 9.9 mm. Ideally, the bell curve would be narrow (i.e., low standard deviation, with numbers dropping off quickly for carriers having less than or greater than the optimal pitch). A wide bell curve indicates that in general the slot pitch in the carrier population was manufactured with poor tolerances and/or there is a high deformation rate. A third report 102 shows latch torque required to actuate the latches for the population of carriers. As shown, the majority of carriers (about 36) require a latching force of 1.75 Newton-meters to actuate the latches. Again, it is desirable to have a narrow bell curve. There is also shown a carrier which was measured as requiring a latch force above 2.5 Newton-meters. This report indicates that that carrier needs to be repaired or replaced.

It is understood that reports for each performance characteristic, both for individual carriers, and the whole carrier population, may be generated from database 100.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

What is claimed is:

1. A load port assembly capable of monitoring characteristics of a carrier having a carrier door removably coupled to a carrier shell, the load port assembly comprising:
    a port door having latch keys capable of decoupling the carrier door from the carrier shell, said port door includes:
        at least one monitoring system selected from a group consisting of (i) a torque measurement system, and (ii) a wafer height measurement system;
    a carrier advance plate having registration pins for engaging the carrier shell while the carrier is seated on said carrier advance plate, and capable of moving a carrier seated upon said carrier advance plate towards said port door, said carrier advance plate includes:
        at least two monitoring systems selected from a group consisting of (i) a carrier identification reader, (ii) a carrier configuration detector, (iii) a resistivity measurement system, (iv) a cleanliness measurement system, (v) a seal performance detector, and (vi) a relative humidity detector.

2. The load port assembly according to claim 1, wherein said torque measurement system is capable of measuring the amount of torque required for said latch keys to decouple the carrier door from the carrier shell.

3. The load port assembly according to claim 1, wherein said wafer height measurement system is capable of detecting each wafer stored in the carrier.

4. The load port assembly according to claim 1, wherein said seal performance detector includes an inlet opening and an outlet opening formed in said carrier advance plate that align with an inlet and outlet valve located in the bottom of the carrier shell when the carrier is seated on said carrier advance plate.

5. The load port assembly according to claim 1, wherein each said monitoring system generates an electronic data signal.

6. The load port assembly according to claim 5, wherein the load port assembly further includes a database for storing said electronic data signals and generating reports.

7. A load port assembly capable of monitoring characteristics of a wafer carrier having a carrier door coupled to a carrier shell, the load port assembly comprising:
    a port door having latch keys to engage the carrier door and decouple the carrier door from the carrier shell, said port door includes:
        means for measuring the torque required to decouple the carrier door from the carrier shell;
        means for detecting each wafer stored in the carrier;
    a carrier advance plate having registration pins for engaging the carrier shell, and capable of moving a carrier seated upon said carrier advance plate towards said port door, said carrier advance plate includes:
        means for identifying the carrier;
        means for determining if the carrier is compatible with the load port assembly;
        means for neutralizing a static charge on the carrier;
        means for measuring the amount of particulates within the carrier;
        means for testing the effectiveness of the seal located between the carrier door and the carrier shell; and
        means for measuring the relative humidity within the carrier.

8. A load port assembly capable of monitoring characteristics of a carrier having a carrier door coupled to a carrier shell, the load port assembly comprising:
    a port door having latch keys to engage the carrier door and decouple the carrier door from the carrier shell, said port door includes:
        a torque measurement system;
        a wafer height measurement system;
    a carrier advance plate having registration pins for engaging the carrier shell while the carrier is seated on said wafer advance plate, and capable of moving a carrier seated upon said carrier advance plate towards said port door, said carrier advance plate includes:
        a carrier identification reader;
        a carrier configuration detector;
        a resistivity measurement system;
        a cleanliness measurement system;
        a seal performance detector; and
        a relative humidity detector.

* * * * *